United States Patent
Cho

(10) Patent No.: US 9,257,209 B2
(45) Date of Patent: Feb. 9, 2016

(54) ELECTROMAGNETIC WAVE GENERATOR AND BIT GENERATOR USING OSCILLATION OF CHARGED PARTICLES

(71) Applicant: Samsung Electronics Co., Ltd., Suwon-si (KR)

(72) Inventor: Sung-nae Cho, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 319 days.

(21) Appl. No.: 13/793,014

(22) Filed: Mar. 11, 2013

(65) Prior Publication Data

US 2014/0042335 A1 Feb. 13, 2014

(30) Foreign Application Priority Data

Aug. 8, 2012 (KR) .................. 10-2012-0086940
Jan. 28, 2013 (KR) .................. 10-2013-0009448

(51) Int. Cl.
| | | |
|---|---|---|
| *H05G 2/00* | (2006.01) | |
| *G21K 5/04* | (2006.01) | |
| *H03K 19/02* | (2006.01) | |
| *H01Q 7/00* | (2006.01) | |
| *H01L 49/02* | (2006.01) | |
| *G11C 11/21* | (2006.01) | |
| *H01L 27/01* | (2006.01) | |

(52) U.S. Cl.
CPC .. *G21K 5/04* (2013.01); *H01Q 7/00* (2013.01); *H03K 19/02* (2013.01); *G11C 11/21* (2013.01); *H01L 27/016* (2013.01); *H01L 28/40* (2013.01)

(58) Field of Classification Search
CPC ........... G21K 5/04; H01Q 7/00; H03K 19/02; H01L 27/016; H01L 28/40; G11C 11/21
USPC .......................................... 250/493.1, 504 R
See application file for complete search history.

(56) References Cited

U.S. PATENT DOCUMENTS

| | | | |
|---|---|---|---|
| 5,675,295 A | 10/1997 | Brebels et al. | |
| 5,729,017 A * | 3/1998 | Brener et al. | ............. 250/338.1 |
| 6,791,505 B2 | 9/2004 | Zaitsev | |
| 9,088,125 B2 * | 7/2015 | Cho | |
| 2005/0117439 A1 | 6/2005 | Kijima | |

(Continued)

FOREIGN PATENT DOCUMENTS

| | | |
|---|---|---|
| JP | 2006-10319 A | 1/2006 |
| JP | 2011-135006 A | 7/2011 |

(Continued)

OTHER PUBLICATIONS

Cho, "Physics of self-sustained oscillations in the positive glow corona", Phys. Plasmas 19, 072113, Jul. 18, 2012, 16 pages total.

(Continued)

*Primary Examiner* — Michael Maskell
(74) *Attorney, Agent, or Firm* — Sughrue Mion, PLLC

(57) ABSTRACT

An electromagnetic wave generator includes first and second electrodes facing each other and spaced apart from each other; a chargeable particle disposed between the first and second electrodes; a voltage source which applies a voltage between the first and second electrodes; and an antenna electrically connected to one of the first and second electrodes and which radiates an electromagnetic wave due to induced current oscillation based on the applied voltage.

48 Claims, 18 Drawing Sheets

(56) References Cited

U.S. PATENT DOCUMENTS

2009/0121949 A1    5/2009  Washiro
2010/0103500 A1*   4/2010  Cho .............................. 359/296
2012/0314270 A1*  12/2012  Cho .............................. 359/230

FOREIGN PATENT DOCUMENTS

| KR | 1020050008466 A | 1/2005 |
| --- | --- | --- |
| KR | 1020060075129 A | 7/2006 |
| KR | 1020070016397 A | 2/2007 |
| KR | 1020090022884 A | 3/2009 |
| KR | 1020090103240 A | 10/2009 |
| KR | 1020120001409 A | 1/2012 |
| KR | 1020120137230 A | 12/2012 |
| WO | 2007/124088 A2 | 11/2007 |

OTHER PUBLICATIONS

Cho, "Charged-particle oscillation in DC voltage biased plane-parallel conductors", Physics of Plasmas 19, 033506, Mar. 9, 2012, pp. 1-25.

International Search Report (PCT/ISA/210) dated May 30, 2013, issued in International Application No. PCT/KR2013/001909.

* cited by examiner

ELECTROMAGNETIC WAVE GENERATOR AND BIT GENERATOR USING OSCILLATION OF CHARGED PARTICLES

CROSS-REFERENCE TO RELATED APPLICATIONS

This application claims the benefits of Korean Patent Application No. 10-2012-0086940, filed on Aug. 8, 2012, and Korean Patent Application No. 10-2013-0009448, filed on Jan. 28, 2013, in the Korean Intellectual Property Office, the disclosures of which are incorporated herein in their entirety by reference.

BACKGROUND

1. Field

The present disclosure relates to electromagnetic wave generators and bit generators.

2. Description of the Related Art

In general, the term "terahertz electromagnetic waves" (hereinafter, also referred to as terahertz waves) refers to electromagnetic waves having a frequency band of about 0.1 to about 10 THz. Terahertz waves may be easily transmitted through materials which microwaves or light waves may not be transmitted through, and may be easily absorbed into moisture. As such, terahertz waves are highly regarded in various technical fields such as medical science, chemistry, military, security, biotechnology, environment, and information communication. However, apparatuses capable of reliably generating an electromagnetic wave of a terahertz band have not been developed, and research is being actively conducted to develop a new terahertz generator.

For example, a terahertz generator using a solid state laser having non-linear crystals, and a terahertz generator using an electromagnetic induction method using a coil or a magnet, is being currently developed. However, currently developed terahertz generators may output terahertz waves of only a certain wavelength, or may have a narrow available band of an output terahertz wave, and thus may be restricted in terms of applicability to various fields. For example, although terahertz waves of different wavelengths are required to obtain tomographic images of different organs (heart, blood vessel, stomach, etc.) in a human body, an existing terahertz generator having a small bandwidth may not satisfy the above requirement. Also, a terahertz generator may have a large power consumption due to a principle of operation of the terahertz generator.

SUMMARY

Provided are electromagnetic wave generators and bit generators.

Additional aspects will be set forth in part in the description which follows and, in part, will be apparent from the description, or may be learned by practice of the presented exemplary embodiments.

According to an aspect of an exemplary embodiment, an electromagnetic wave generator includes a first electrode and a second electrode facing and spaced apart from the first electrode; a chargeable particle disposed between the first and the second electrodes; a voltage source which applies a voltage between the first and second electrodes; and an antenna which is electrically connected to one of the first and the second electrodes and which radiates an electromagnetic wave due to induced current oscillation based on the applied voltage.

The voltage source may apply a direct current (DC) voltage between the first and the second electrodes, and the induced current oscillation may be generated due to self-sustained oscillation of the chargeable particle based on the applied DV voltage.

The electromagnetic wave generator may further include a chamber disposed between the first and the second electrodes, the chamber including a vacuum therein or being filled with a noble gas, and the chargeable particle may be disposed in the chamber.

The first and the second electrodes may have shapes of a cylindrical core and a cylindrical shell, respectively. In this case, the first and the second electrodes may form inner walls of the chamber.

The chamber may be formed as a through hole formed in a dielectric structure, the through hole may be formed in a cylindrical shape, and the first and the second electrodes may be respectively formed to cover an upper portion and a lower portion of the through hole.

The chargeable particle may include a conductive material or an ionized atom which is electrically chargeable.

The chargeable particle may be a particle that is constantly maintained in a charged state regardless of whether the voltage is applied between the first and the second electrodes, or a particle that is charged only when the voltage is applied between the first and the second electrodes and is discharged when the applying of the voltage is stopped.

If the chargeable particle is positively charged, the chargeable particle may oscillate near an anode from among the first and the second electrodes. In this case, the antenna may be electrically connected to the anode.

If the chargeable particle is negatively charged, the chargeable particle may oscillate near a cathode from among the first and the second electrodes. In this case, the antenna may be electrically connected to the cathode.

The antenna may include a rod antenna, a helical antenna, or a circular antenna.

The one or more chargeable particles may be core-shell structured where a conductive core is surrounded by a dielectric shell.

According to another aspect of an exemplary embodiment, an electromagnetic wave generator includes a first electrode and a second electrode facing and spaced apart from the first electrode; a plurality of chambers disposed between the first and the second electrodes; one or more chargeable particles disposed in each of the plurality of chambers; a voltage source which applies a voltage between the first and the second electrodes; and an antenna electrically connected to one of the first and the second electrodes and which radiates an electromagnetic wave due to induced current oscillation based on the applied voltage.

The plurality of chambers may be formed as a plurality of through holes in a dielectric substrate, and the first and the second electrodes may be respectively formed on top of and under the dielectric substrate to cover the plurality of through holes.

According to another aspect of an exemplary embodiment, an electromagnetic wave generator includes one or more chargeable particles; a chamber structure which forms an inner space in which the one or more chargeable particles are disposed, and which comprises an electrode unit which forms an electric field in the inner space; a power circuit unit comprising a voltage source which applies a voltage to the electrode unit in order to form the electric field in the inner space; and an antenna electrically connected to the electrode unit and which radiates an electromagnetic wave due to induced current oscillation based on the applied voltage.

The chamber structure may include a first electrode and a second electrode facing and spaced apart from the first electrode; a spacer surrounding a space between the first and the second electrodes to form the inner space; and a wire disposed to cross the inner space and having one end penetrating through the spacer and exposed to an external environment.

The power circuit unit may be configured to enable the first and the second electrodes to have a same potential and to apply the voltage between the first and second electrodes and the wire.

The one or more chargeable particles may be positively charged, and the wire and the first and the second electrodes may be connected to the voltage source in such a way that the wire functions as an anode and that the first and the second electrodes function as a cathode. In this case, the antenna may have one end connected to the wire.

Alternately, the chamber structure may include a first electrode and a second electrode facing and spaced apart from the first electrode; a spacer surrounding a space between the first and the second electrodes to form the inner space, and formed of a conductive material; a first insulator disposed between the spacer and the first electrode to insulate the spacer and the first electrode from each other; a second insulator disposed between the spacer and the second electrode to insulate the spacer and the second electrode from each other; and a wire which electrically connects the first and second electrodes in the inner space.

The power circuit unit may be configured to enable the first and the second electrodes to have a same potential and to apply the voltage between the first and the second electrodes and the spacer.

The one or more chargeable particles may be positively charged, and the wire and the first and the second electrodes may be connected to the voltage source in such a way that the wire functions as an anode and that the first and second electrodes function as a cathode. In this case, the antenna may have one end connected to the first electrode or the second electrode.

According to another aspect of an exemplary embodiment, a bit generator includes one or more chargeable particles; a chamber structure which forms an inner space in which the one or more chargeable particles are disposed, and which comprises an electrode unit which forms an electric field in the inner space; a voltage source which applies a voltage to the electrode unit in order to form the electric field in the inner space; a control unit which controls the voltage source to selectively apply the voltage to the electrode unit; and a data storage unit which stores bit data corresponding to whether induced current oscillation is generated by the electrode unit.

The chamber structure may include a first electrode and a second electrode facing and spaced apart from the first electrode; and a spacer surrounding a space between the first and the second electrodes to form the inner space.

The one or more chargeable particles may be positively charged, and the data storage unit may be connected to an anode from among the first and the second electrodes.

The one or more chargeable particles may be negatively charged, and the data storage unit may be connected to a cathode from among the first and the second electrodes.

The one or more chargeable particles may be core-shell structured where a conductive core is surrounded by a dielectric shell.

According to another aspect of an exemplary embodiment, a logic circuit includes a barrier structure which forms a first inner space and a second inner space separated from the first inner space; one or more chargeable particles disposed in each of the first and second inner spaces; a first electrode and a second electrode formed under the barrier structure which respectively cover a bottom portion of the first inner space and the second inner space; and a common electrode formed on the barrier structure which covers a top portion of the first inner space and the second inner space, wherein the logic circuit performs a logic operation by using an output voltage from the common electrode according to input voltages applied to the first and the second electrodes.

The logic circuit may further include a resistor connected to the common electrode.

The resistor may be connected to a voltage source having a fixed voltage, or may be grounded.

A number of the chargeable particles may be equal to or less than a thousand.

According to another aspect of an exemplary embodiment, a memory circuit includes one or more chargeable particles; a barrier structure which forms an inner space which accommodates the one or more chargeable particles; a first electrode formed on the barrier structure which covers a top portion of the inner space; a second electrode formed under the barrier structure which covers a bottom portion of the inner space; a capacitor and a first resistor spaced apart from each other on the first electrode; and a second resistor formed on the second electrode.

BRIEF DESCRIPTION OF THE DRAWINGS

These and/or other aspects will become apparent and more readily appreciated from the following description of the exemplary embodiments, taken in conjunction with the accompanying drawings of which.

DETAILED DESCRIPTION

Figure 1:
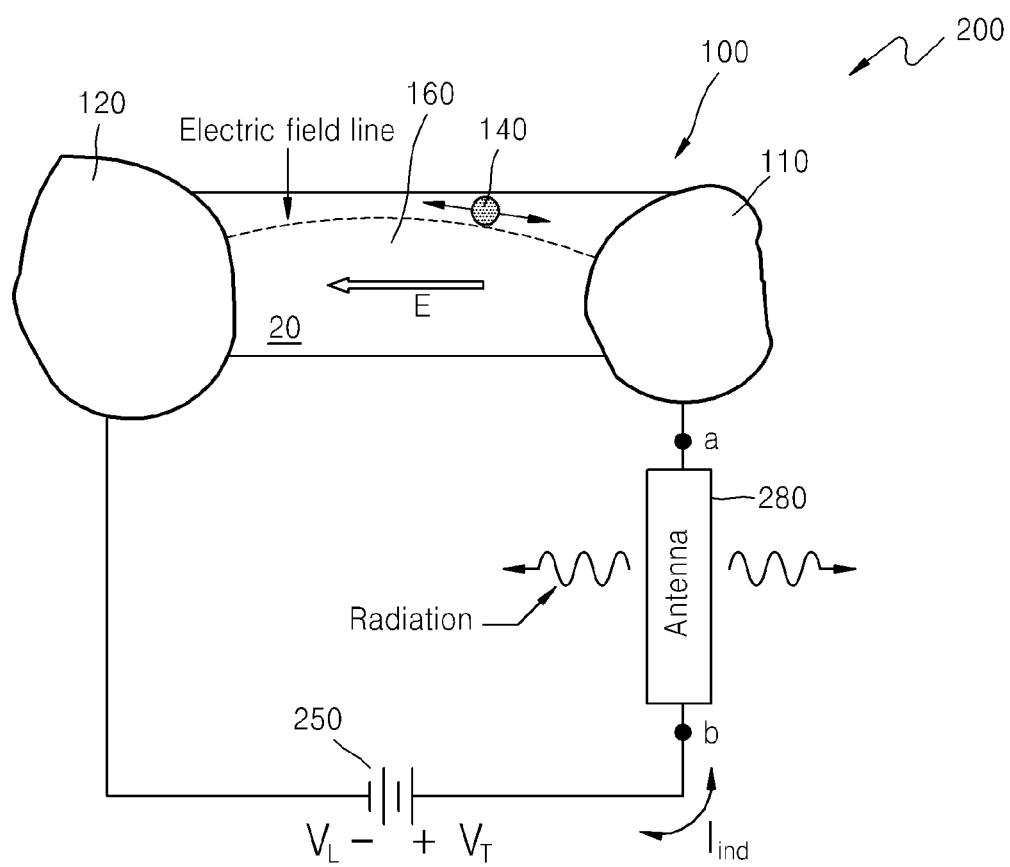
FIG. 1 is a conceptual view of an electromagnetic wave generator according to an exemplary embodiment.

Reference will now be made in detail to exemplary embodiments, examples of which are illustrated in the accompanying drawings, wherein like reference numerals refer to the like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Figure 2A:
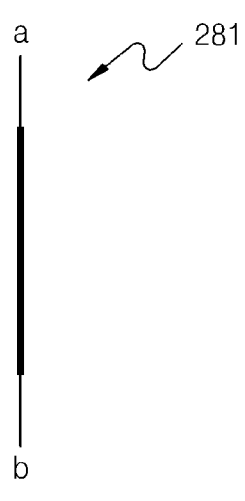
FIGS. 2A through 2C are structural views of exemplary antenna units employable in the electromagnetic wave generator illustrated in FIG. 1.
Figure 2B:
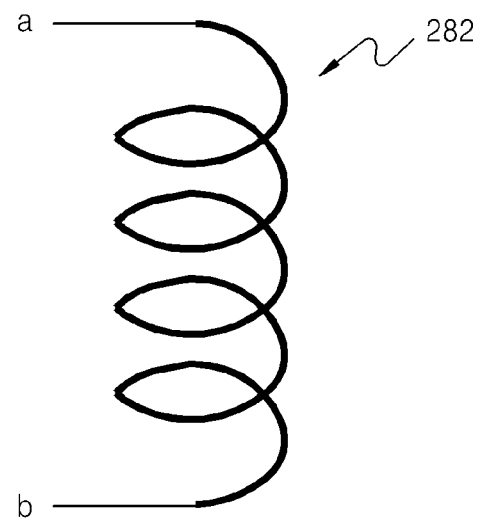
Figure 2C:
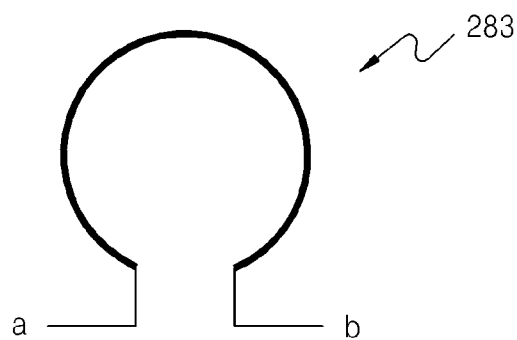

FIG. 1 is a conceptual view of an electromagnetic wave generator 200 according to an exemplary embodiment. FIGS. 2A through 2C are structural views of exemplary antenna units employable in the electromagnetic wave generator 200 illustrated in FIG. 1.

The electromagnetic wave generator 200 includes first and second electrodes 110 and 120 facing each other and spaced apart from each other, a chargeable particle 140 disposed between the first and second electrodes 110 and 120, a voltage source 250 for applying a voltage between the first and second electrodes 110 and 120, and an antenna unit 280 (e.g., antenna) electrically connected to one of the first and second electrodes 110 and 120 and for radiating an electromagnetic wave (e.g., terahertz wave) due to induced current oscillation $I_{ind}$.

The electromagnetic wave generator 200 has a structure in which, when the voltage source 250 applies a direct current (DC) voltage between the first and second electrodes 110 and 120, self-sustained oscillation of the chargeable particle 140 occurs and thus the induced current oscillation $I_{ind}$ is generated.

A chamber 160 may, for example, be a vacuum or may be filled with a noble gas, may be further disposed between the first and second electrodes 110 and 120, and the chargeable particle 140 may be disposed in the chamber 160.

The first and second electrodes 110 and 120, the chamber 160, and the chargeable particle 140 form a self-sustained oscillation forming unit 100, and examples of the self-sustained oscillation forming unit 100 according to various modifications of an electrode structure or the chamber 160 will be described below.

The chamber 160 provides, together with the first and second electrodes 110 and 120, a space where the chargeable particle 140 is disposed and oscillates. The chamber 160 may not have any charged particles or gas other than the chargeable particle 140. To achieve this configuration, the chamber 160 may maintain its inner space 20 in a vacuum. Alternatively, the chamber 160 may be filled with a noble gas, e.g., helium (He), neon (Ne), argon (Ar), krypton (Kr), or xenon (Xe), or a gas for suppressing electrical discharge of the chargeable particle 140, e.g., sulfur hexafluoride ($SF_6$).

The chargeable particle 140 may include a conductive material or an ionized atom which is electrically chargeable. The chargeable particle 140 may be core-shell structured where a conductive core is surrounded by a dielectric shell. If the voltage source 250 applies the voltage between the first and second electrodes 110 and 120, an electric field E is formed between the first and second electrodes 110 and 120, and oscillation of a charged particle occurs in the electric field E. The chargeable particle 140 may function as a charged particle that oscillates in the electric field E after being positively or negatively charged, may be a particle that is already charged and is constantly maintained in the charged state regardless of whether the voltage is applied between the first and second electrodes 110 and 120, or may be a particle that is charged only when the voltage is applied between the first and second electrodes 110 and 120 and is discharged when the applying of the voltage is stopped.

Oscillation of the chargeable particle 140 occurs in the form of the induced current oscillation $I_{ind}$ that becomes a source of an electromagnetic wave. The antenna unit 280 is provided to externally transmit an electromagnetic wave generated due to the induced current oscillation $I_{ind}$.

As illustrated in FIGS. 2A through 2C, the antenna unit 280 may be, but is not limited to being, a rod antenna 281, a helical antenna 282, or a circular antenna 283. The electromagnetic wave generator 200 generates an electromagnetic wave having a frequency corresponding to an oscillation cycle of the chargeable particle 140 and, in this case, the frequency relates to the voltage applied between the first and second electrodes 110 and 120 by the voltage source 250. That is, the shape of the antenna unit 280 may be determined to efficiently radiate the electromagnetic wave generated due to the voltage applied between the first and second electrodes 110 and 120 by the voltage source 250, in consideration of the voltage and the frequency of the electromagnetic wave.

Although the antenna unit 280 is electrically connected to the first electrode 110 in FIG. 1, the electric connection of the antenna unit 280 is not limited thereto. If the chargeable particle 140 is positively charged, the chargeable particle 140 may oscillate near an anode from among the first and second electrodes 110 and 120 and, in this case, the antenna unit 280 may be electrically connected to the first electrode 110 which may function as an anode. On the other hand, if the chargeable particle 140 is negatively charged, the chargeable particle 140 may oscillate near a cathode from among the first and second electrodes 110 and 120 and, in this case, the antenna unit 280 may be electrically connected to the second electrode 120 which may function as a cathode.

The principle that self-sustained oscillation of a charged particle occurs in the electromagnetic wave generator 200 will now be briefly described.

Figure 3A:
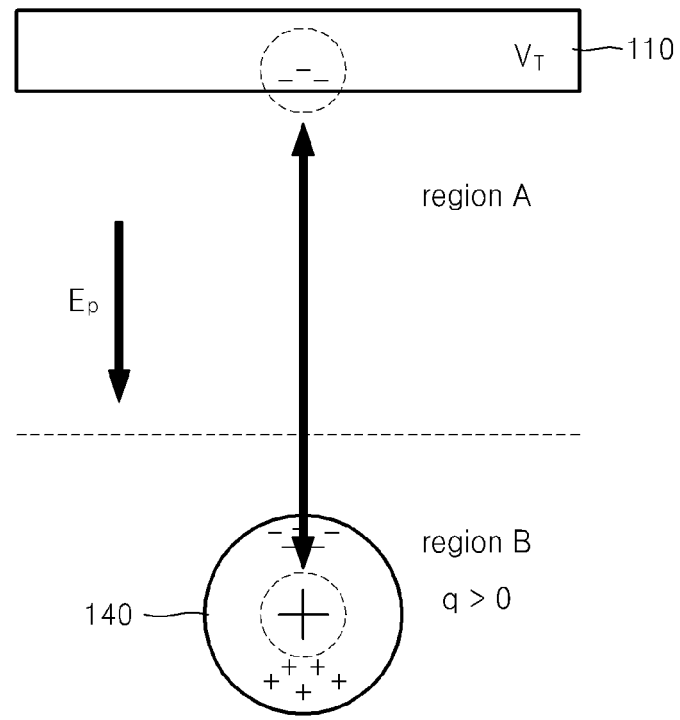
FIGS. 3A and 3B are conceptual views for describing self-sustained oscillation of a charged particle in the electromagnetic wave generator illustrated in FIG. 1.
Figure 3B:
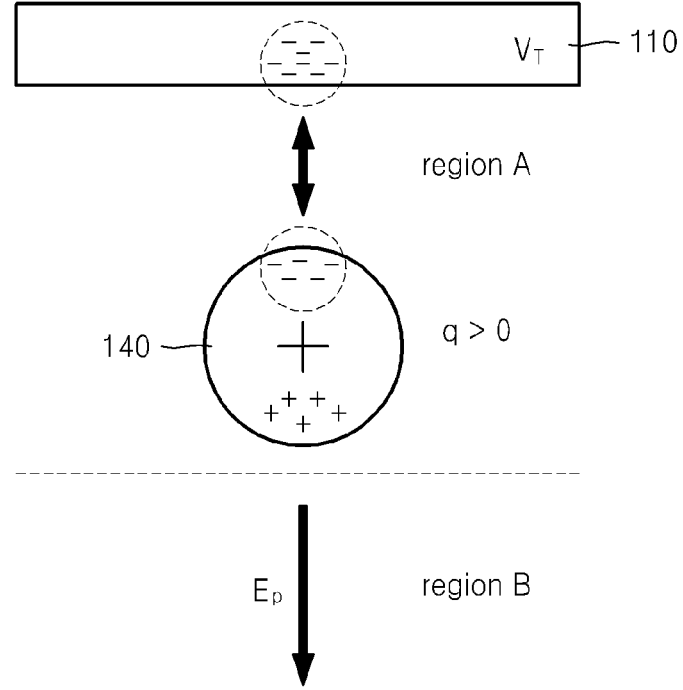
Figure 4:
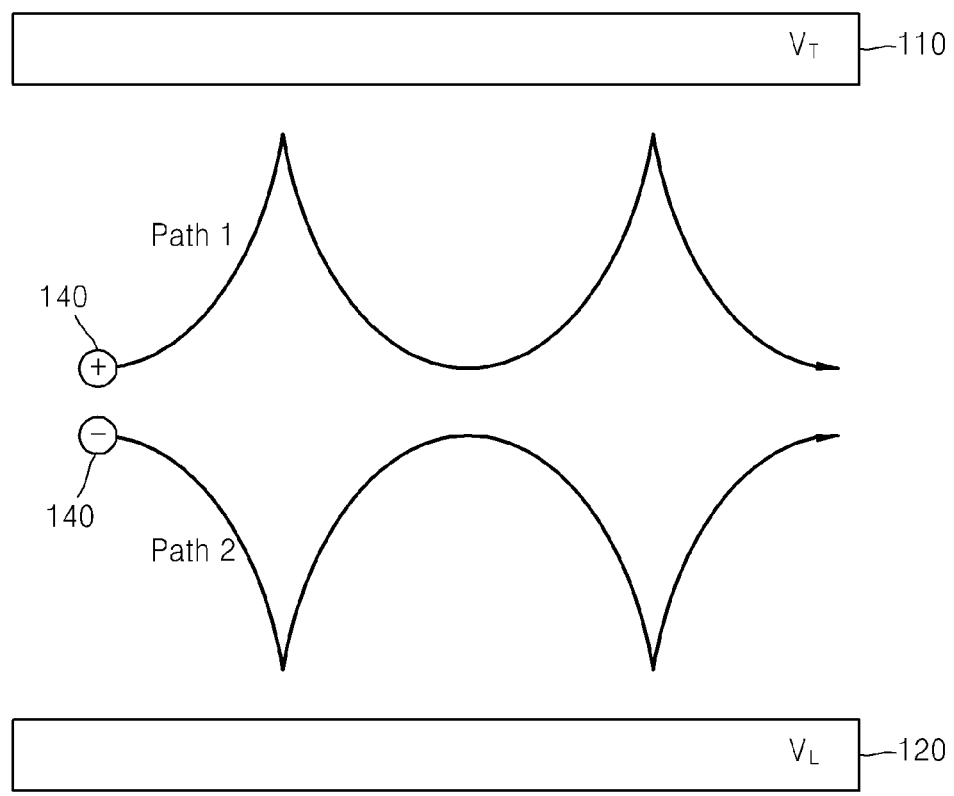
FIG. 4 is a conceptual view exemplarily showing trajectories of oscillation when a chargeable particle is positively and negatively charged in the electromagnetic wave generator illustrated in FIG. 1.

FIGS. 3A and 3B are conceptual views for describing self-sustained oscillation of a charged particle in the electromagnetic wave generator 200 illustrated in FIG. 1. FIG. 4 is a conceptual view exemplarily showing trajectories of oscillation when the chargeable particle 140 is positively and negatively charged in the electromagnetic wave generator 200 illustrated in FIG. 1.

Before the voltage is applied between the first and second electrodes 110 and 120, the chargeable particle 140 may be put on a surface of the first electrode 110, a surface of the second electrode 120, or a bottom surface of the chamber 160 along a direction of gravity. In this case, the chargeable particle 140 may be in an electrically uncharged state. Accordingly, in order to charge the chargeable particle 140 when the electromagnetic wave generator 200 starts to operate, an initial voltage is applied between the first and second electrodes 110 and 120. For example, when the chargeable particle 140 is formed of an aluminum material, if the voltage is applied between the first and second electrodes 110 and 120 to form an electric field equal to or greater than about 700V/mm, an electron pops out of each aluminum atom forming the chargeable particle 140 and flows out through the first electrode 110, and the chargeable particle 140 is positively (+) charged. If the chargeable particle 140 is already charged and the charged state is constantly maintained regardless of whether the voltage is applied between the first and second electrodes 110 and 120, the above-described initialization process may not be required. However, if the chargeable particle 140 is charged only when the voltage is applied between the first and second electrodes 110 and 120 and is discharged when the applying of the voltage is stopped, the above-described initialization process may be required.

Then, if an appropriate DC voltage is applied between the first and second electrodes 110 and 120 according to a wavelength of a desired electromagnetic wave, an electric field may be generated in a direction from the first electrode 110 toward the second electrode 120, and the charged chargeable particle 140 may oscillate to reciprocate between the first and second electrodes 110 and 120.

Oscillation of the chargeable particle 140 may be mathematically predicted according to the Laplace equation, positions and potentials of the first and second electrodes 110 and 120, and boundary conditions determined based on the surface charge density of the charged or chargeable particle 140. Since the surface charge density induced on surfaces of the first and second electrodes 110 and 120 varies according to the position of the chargeable particle 140, an attractive or repulsive force predominantly acts on the chargeable particle 140. For example, if a potential $V_T$ of the first electrode 110 is greater than a potential $V_L$ of the second electrode 120 to make a direction of an electric field Ep to be from the first electrode 110 toward the second electrode 120, and the chargeable particle 140 is positively (+) charged, negative charges are distributed on an upper hemisphere of the chargeable particle 140 and positive charges are distributed on a lower hemisphere of the chargeable particle 140 due to a depolarization field, and a sum of the charges on the upper and lower hemispheres is positive (+). In addition, negative charges are also distributed on the surface of the first electrode 110. The charge density induced on the surface of the first electrode 110 is reduced if the chargeable particle 140 is located away from the first electrode 110, and is increased if the chargeable particle 140 is located close to the first electrode 110.

Accordingly, as illustrated in FIG. 3A, the chargeable particle 140 is located away from the first electrode 110 by a distance equal to or greater than a certain distance (region B), and an attractive force is dominant between total charges of the chargeable particle 140 (q>0) and the first electrode 110. Consequently, the chargeable particle 140 moves toward the first electrode 110. If the chargeable particle 140 approaches the first electrode 110 and thereby moves within a certain distance of the first electrode 110 (region A), the density of negative charges induced on the surface of the first electrode 110 is increased and, as illustrated in FIG. 3B, a repulsive force becomes dominant due to the negative charges induced on the surface of the first electrode 110 and the negative charges distributed on the upper hemisphere of the chargeable particle 140. As a result, the chargeable particle 140 moves away from the first electrode 110. According to the above principle, the chargeable particle 140 oscillates between regions A and B.

FIGS. 3A and 3B exemplarily illustrate a case when the chargeable particle 140 is positively charged and oscillates near the first electrode 110 that may function as an anode. However, if the chargeable particle 140 is negatively charged, the chargeable particle 140 oscillates near the second electrode 120 that may function as a cathode. That is, as illustrated in FIG. 4, the chargeable particle 140 that is positively charged oscillates along path 1 that repeatedly moves close to and then away from the first electrode 110 that is an anode, and the chargeable particle 140 that is negatively charged oscillates along path 2 that repeatedly moves close to and then away from the second electrode 120 that is a cathode. With respect to paths 1 and 2 in FIG. 4, a vertical axis represents a distance from an electrode and a horizontal axis represents time.

Mathematic calculation on oscillation of a charged particle is described in detail in papers of the present inventor. See "Phys. Plasmas 19," 033506 (2012), doi: 10.1063/1.3690104; see also "Phys. Plasmas 19," 072113 (2012), doi: 10.1063/1.4737189.

Figure 5:
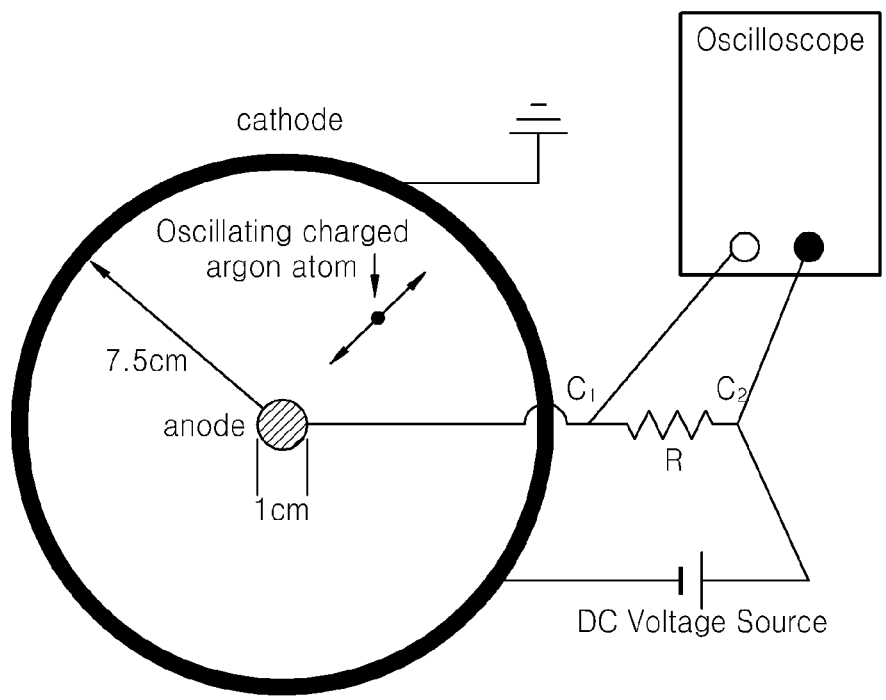
FIG. 5 shows an experimental setting for checking oscillation of a charged particle in the electromagnetic wave generator illustrated in FIG. 1.

FIG. 5 shows an experimental setting for checking oscillation of the charged or chargeable particle 140 in the electromagnetic wave generator 200 illustrated in FIG. 1.

A cathode is formed in a cylindrical shell shape, an anode is formed in a cylindrical core shape at the center of the cathode, and a charged Ar atom is used as a charged particle. If a DC voltage is applied between the cathode and the anode, the charged particle oscillates, and it is expected that a potential oscillates at position $C_1$ with an oscillation frequency corresponding to the oscillation frequency of the charged particle.

FIGS. 6A through 6D and 7A through 7D are graphs showing waveforms of induced voltages measured while adjusting a bias voltage, a pressure in a chamber, and other factors, in the experimental setting illustrated in FIG. 5.

Figure 6A:
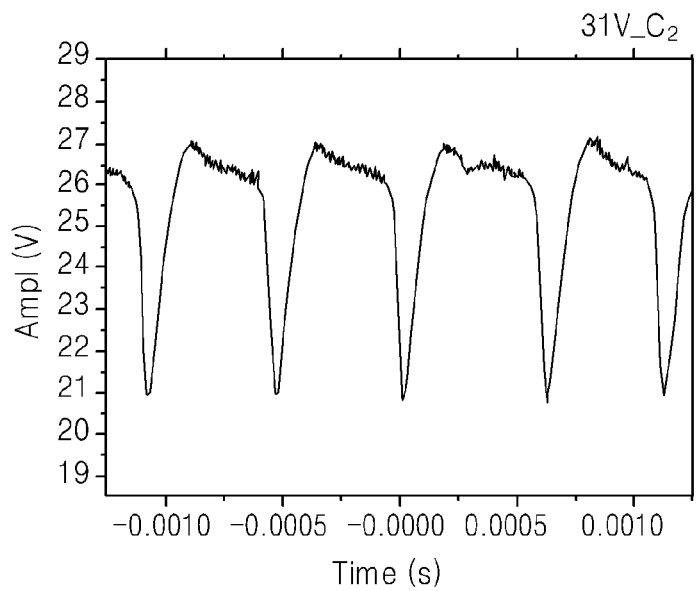
FIGS. 6A through 6D, and 7A through 7D are graphs showing waveforms of induced voltages measured while adjusting a bias voltage, a pressure in a chamber, and other factors, in the experimental setting illustrated in FIG. 5.
Figure 6B:
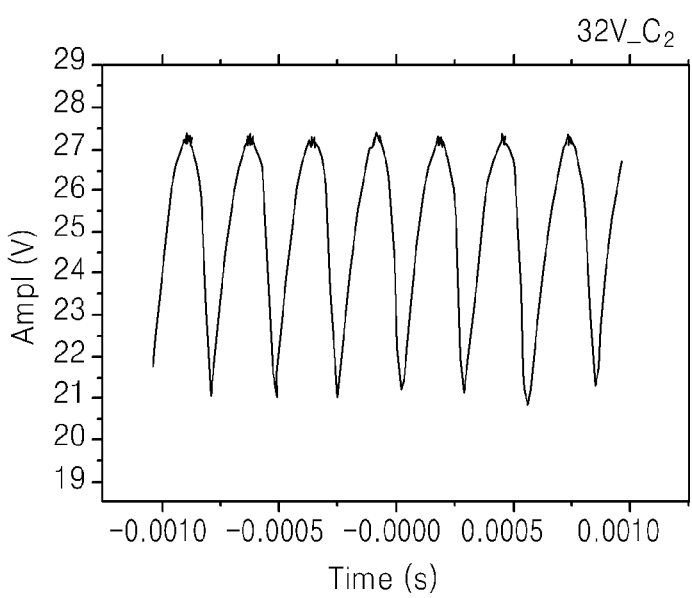
Figure 6C:
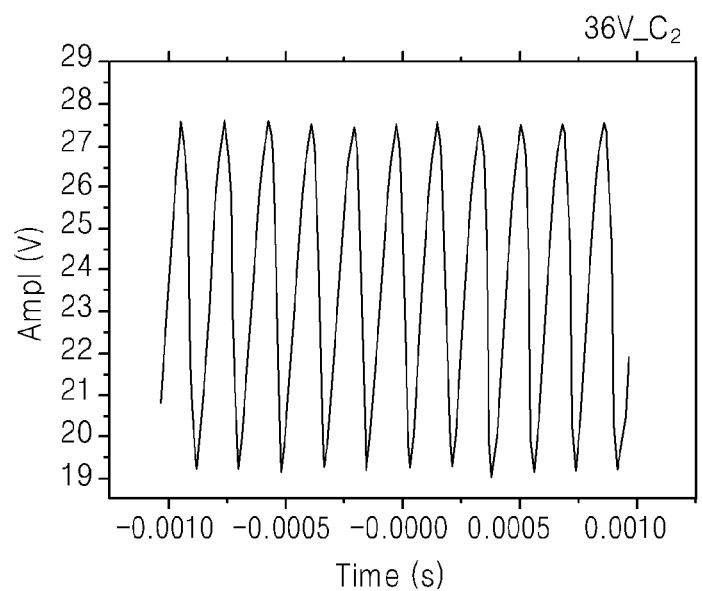
Figure 6D:
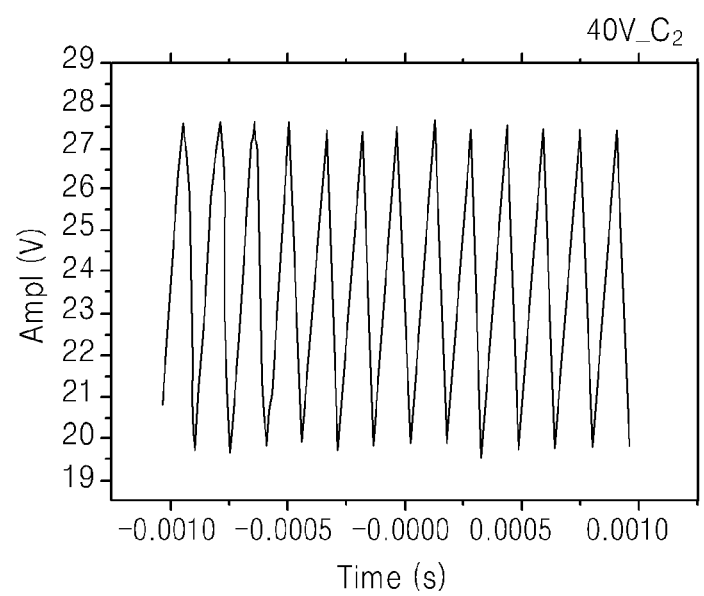

FIGS. 6A through 6D show waveforms of voltages measured at position $C_1$ when a pressure of Ar in a chamber is set to 31 mTorr, a resistance R is set to 124 kOhm, and a potential at position $C_2$ varies to 31V (FIG. 6A), 32V (FIG. 6B), 36V (FIG. 6C), and 40V (FIG. 6D).

Figure 7A:
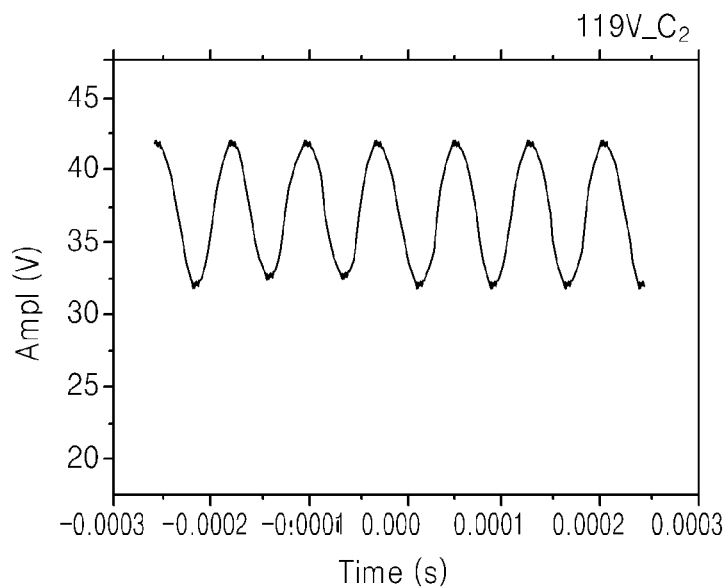
Figure 7B:
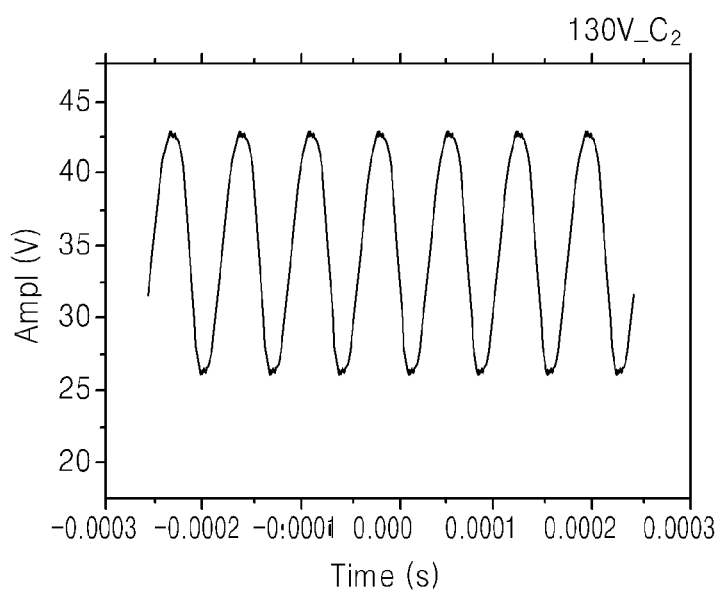
Figure 7C:
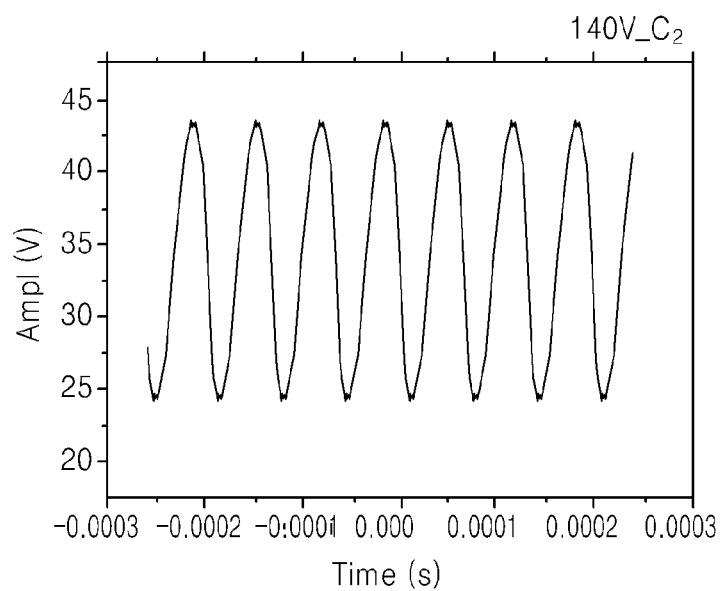
Figure 7D:
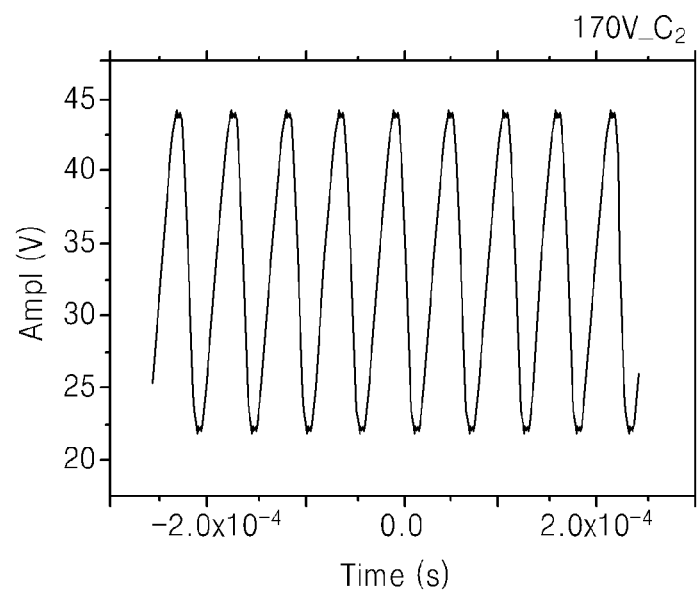

FIGS. 7A through 7D show waveforms of voltages measured at position $C_1$ when the pressure of Ar in a chamber is set as 2 mTorr, the resistance R is set as 1 MOhm, and the potential at position $C_2$ varies to 119V (FIG. 7A), 130V (FIG. 7B), 140V (FIG. 7C), and 170V (FIG. 7D).

Based on experimental results, it can be seen that induced current oscillation occurs due to oscillation of the charged particle and the frequency of the inducted current oscillation is adjustable based on a voltage applied between a cathode and an anode.

Figure 8A:
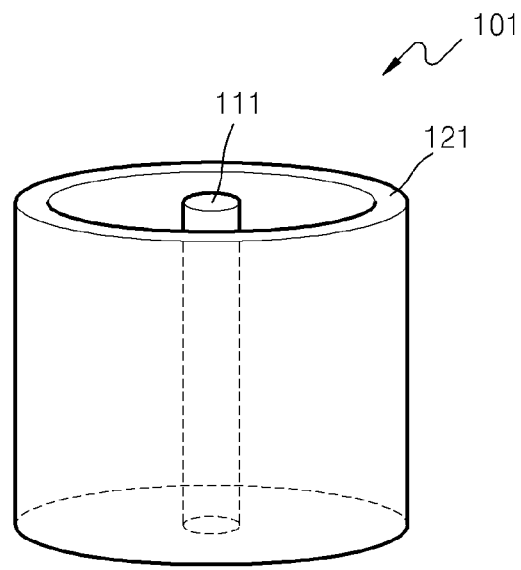
FIGS. 8A and 8B are perspective and plan views of an exemplary self-sustained oscillation forming unit employable in the electromagnetic wave generator illustrated in FIG. 1.
Figure 8B:
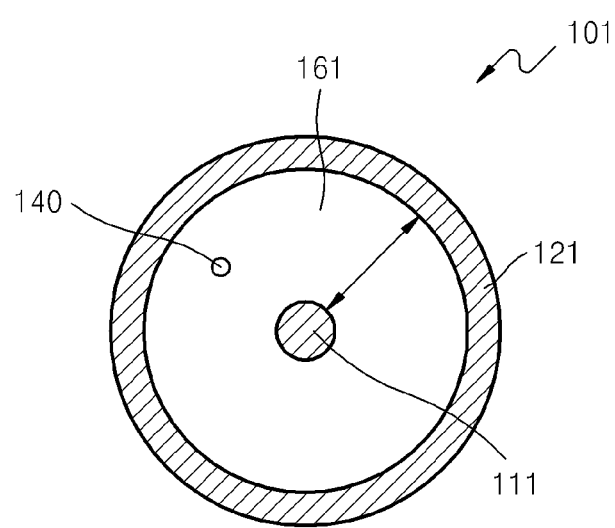

FIGS. 8A and 8B are perspective and plan views of an exemplary self-sustained oscillation forming unit 101 employable in the electromagnetic wave generator 200 illustrated in FIG. 1.

The self-sustained oscillation forming unit 101 may have the structure of the experimental setting illustrated in FIG. 5. In more detail, a first electrode 111 may be formed in a cylindrical shell shape, a second electrode 121 may be formed in a cylindrical core shape, and the first and second electrodes 111 and 121 may form inner walls of a chamber 161. Also, a capping member may be formed to cover upper and lower portions of the chamber 161.

Figure 9A:
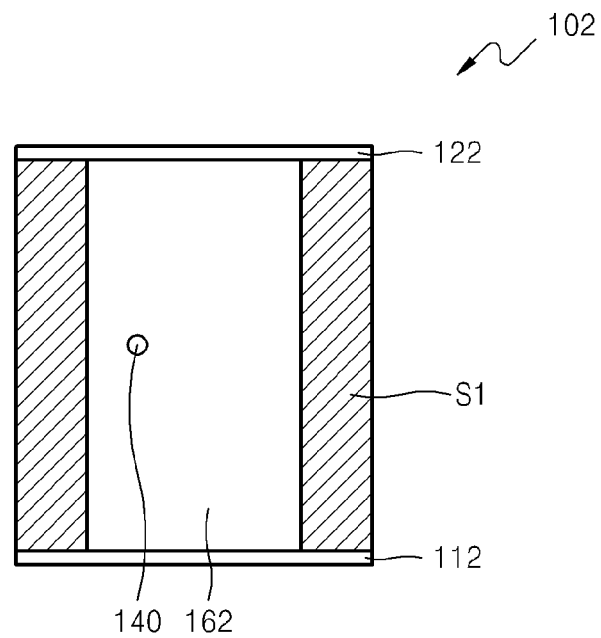
FIG. 9A is a cross-sectional view of another exemplary self-sustained oscillation forming unit employable in the electromagnetic wave generator illustrated in FIG. 1.
Figure 9B:
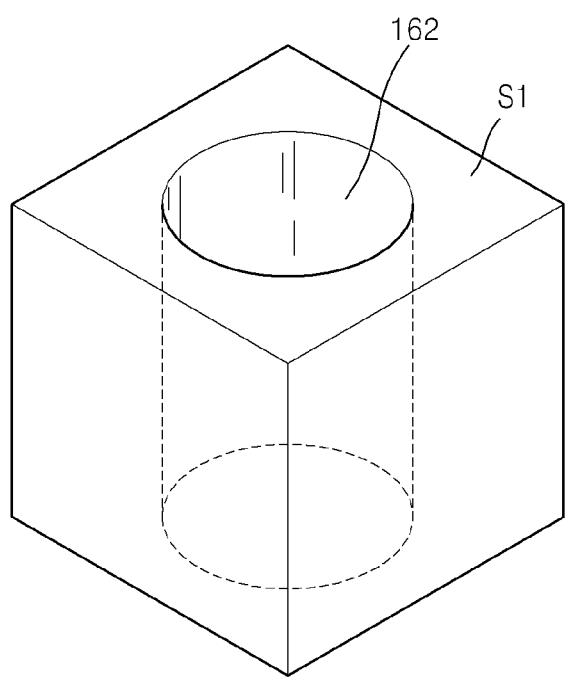
FIG. 9B is a detailed perspective view of a chamber illustrated in FIG. 9A.

FIG. 9A is a cross-sectional view of another exemplary self-sustained oscillation forming unit 102 employable in the electromagnetic wave generator 200 illustrated in FIG. 1. FIG. 9B is a detailed perspective view of a chamber 162 illustrated in FIG. 9A.

The self-sustained oscillation forming unit 102 shown in FIGS. 9A and 9B includes a dielectric structure 51 having a through hole forming the chamber 162, and first and second electrodes 112 and 122 respectively formed on and under the dielectric structure 51 to cover the chamber 162. The through hole may have, but is not limited to having, a cylindrical shape as illustrated in FIGS. 9A and 9B.

Figure 10A:
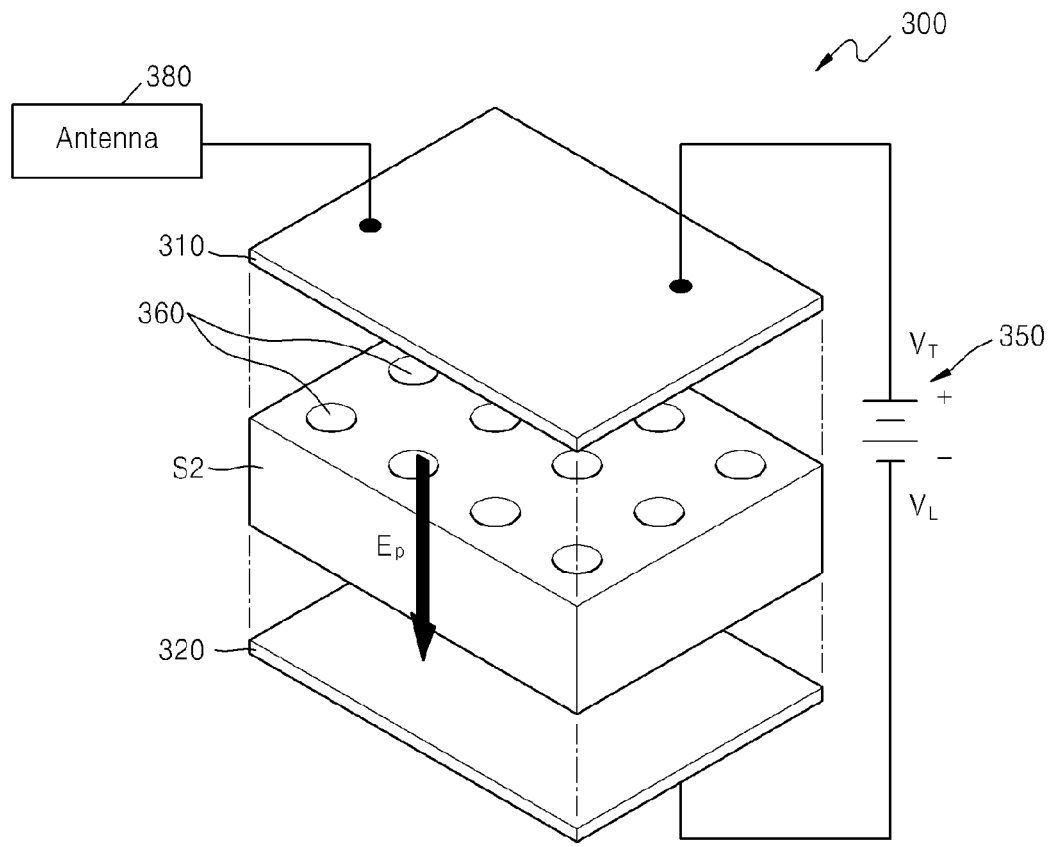
FIGS. 10A and 10B are perspective and cross-sectional views of an electromagnetic wave generator according to another exemplary embodiment.
Figure 10B:
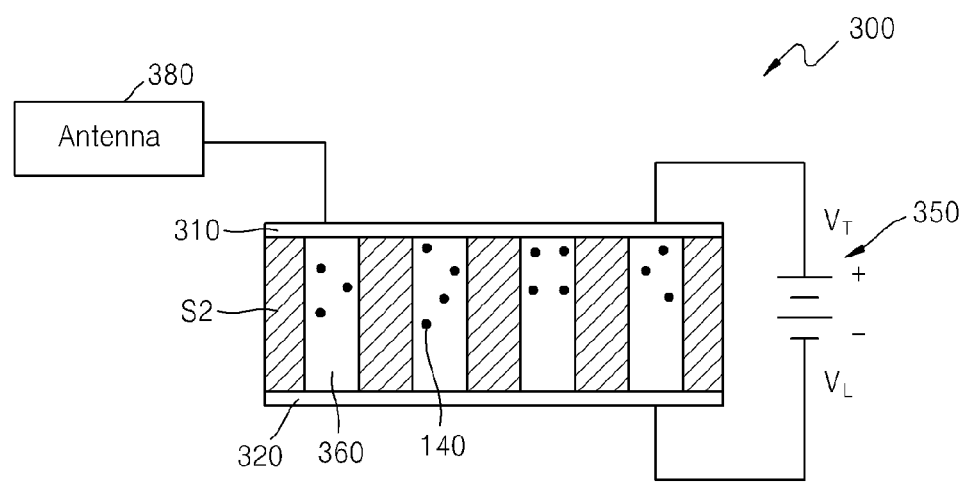

FIGS. 10A and 10B are perspective and cross-sectional views of an electromagnetic wave generator 300 according to another exemplary embodiment.

The electromagnetic wave generator 300 includes first and second electrodes 310 and 320 facing each other and spaced apart from each other, a plurality of chambers 360 disposed between the first and second electrodes 310 and 320, one or more chargeable particles 140 disposed in each of the chambers 360, a voltage source 350 for applying a voltage between the first and second electrodes 310 and 320, and an antenna unit 380 electrically connected to one of the first and second electrodes 310 and 320 and for radiating an electromagnetic wave due to induced current oscillation.

As illustrated in FIGS. 10A and 10B, the chambers 360 may be formed of a dielectric substrate S2 having a plurality of through holes, and the first and second electrodes 310 and 320 may be respectively formed on top of and under the dielectric substrate S2 to cover the through holes. The through holes may each have, but are not limited to having, a cylindrical shape as illustrated in FIGS. 10A and 10B. The chambers 360 may be in a vacuum or may be filled with a noble gas.

Each of the chargeable particles 140 disposed in the chambers 360 may include a conductive material or an ionized atom, and may be a particle that is already charged and is constantly maintained in the charged state regardless of whether the voltage is applied between the first and second electrodes 310 and 320, or may be a particle that is charged only when the voltage is applied between the first and second electrodes 310 and 320 and is discharged when the applying of the voltage is stopped. Although FIGS. 10A and 10B show a plurality of chargeable particles 140 disposed in each of the chambers 360, the number of chargeable particles 140 is not limited thereto, and each of the chambers 360 may alternatively include one or any other plural number of chargeable particles 140.

If the chargeable particles 140 are positively charged, the chargeable particles 140 may oscillate near an anode from among the first and second electrodes 310 and 320 and the antenna unit 380 may be electrically connected to the first electrode 310 which may function as an anode, as illustrated in FIGS. 10A and 10B. On the other hand, if the chargeable particles 140 are negatively charged, the chargeable particles 140 may oscillate near a cathode from among the first and second electrodes 310 and 320 and, in this case, the antenna unit 380 may be electrically connected to the second electrode 320 which may function as a cathode, unlike the case illustrated in FIGS. 10A and 10B.

As illustrated in FIGS. 2A through 2C, the antenna unit 380 may be, but is not limited to being, a rod antenna 281, a helical antenna 282, or a circular antenna 283.

The voltage source 350 may apply a DC voltage between the first and second electrodes 310 and 320. For example, the voltage source 350 may form a potential $V_T$ on the first electrode 310 and may form a potential $V_L$, which is less than the potential $V_T$, on the second electrode 320. In this case, self-sustained oscillation of the chargeable particles 140 occurs in the chambers 360. According to a sum of amplitudes of induced current oscillation that occurs in the chambers 360, an electromagnetic wave having a large amplitude may be generated and may be efficiently transmitted by the antenna unit 380.

Figure 11A:
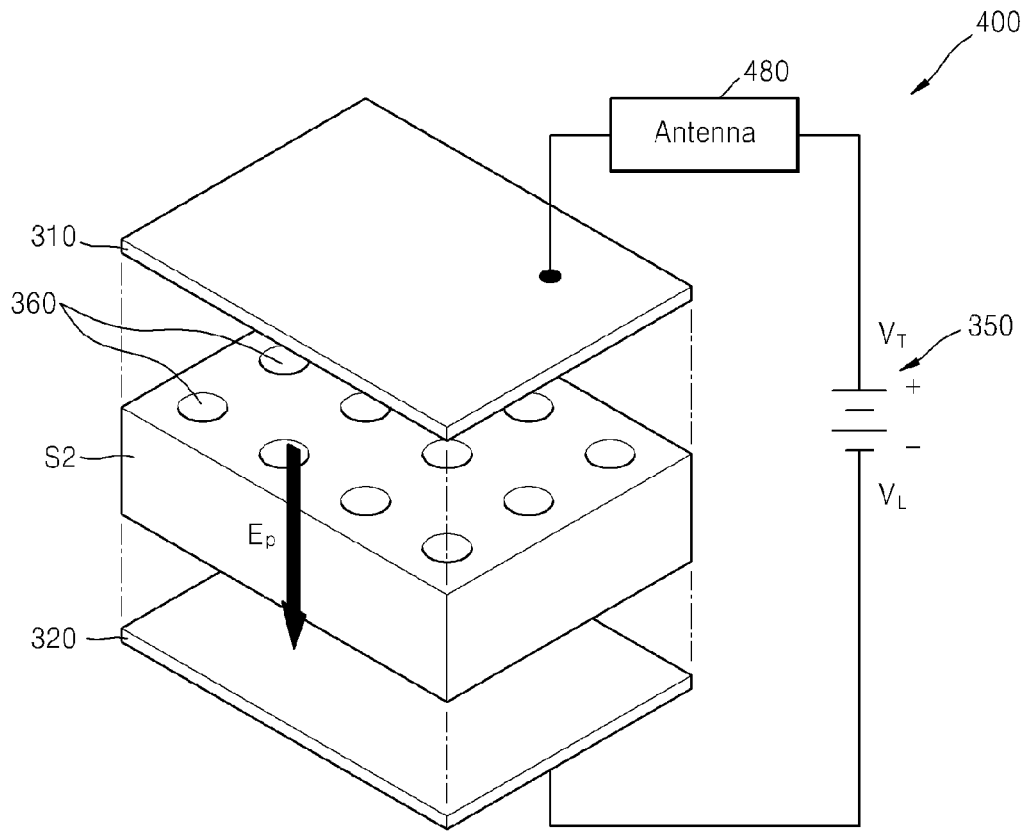
FIGS. 11A and 11B are perspective and cross-sectional views of an electromagnetic wave generator according to another exemplary embodiment.
Figure 11B:
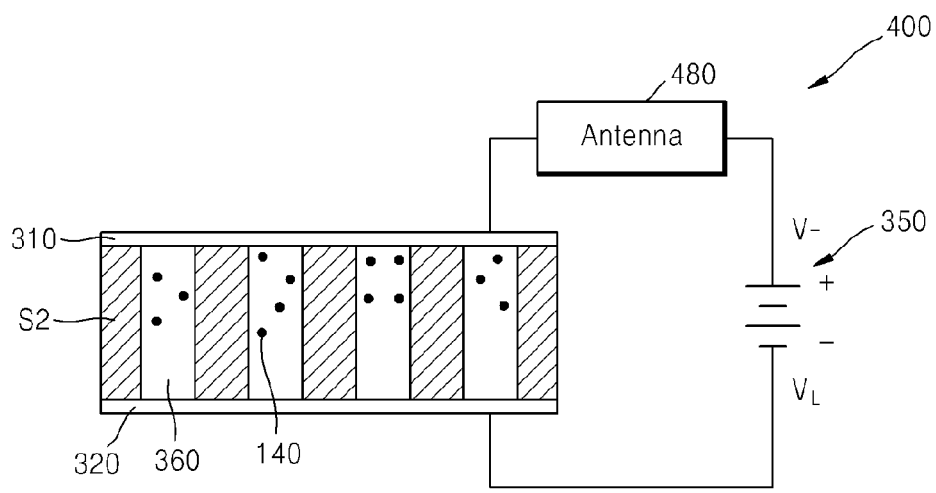

FIGS. 11A and 11B are perspective and cross-sectional views of an electromagnetic wave generator 400 according to another exemplary embodiment.

The electromagnetic wave generator 400 according to the exemplary embodiment shown in FIGS. 11A and 11B is different from the electromagnetic wave generator 300 illustrated in FIG. 10A, in that a position of an antenna unit 480 is different from a position of the antenna unit 380. The antenna unit 480 is connected between the first electrode 310 and the voltage source 350.

The antenna unit 380 or 480 illustrated in FIG. 10A or 11A may be selected according to various criteria of a user, for example, the frequency or intensity of, or a distance for transmitting, an electromagnetic wave to be generated due to induced current oscillation.

In FIGS. 11A and 11B, it is assumed that the chargeable particles 140 are positively charged. In this case, the chargeable particles 140 may oscillate near an anode from among the first and second electrodes 310 and 320, and the antenna unit 480 may be electrically connected between the voltage source 350 and the first electrode 310 may function as an anode.

Meanwhile, the chargeable particles 140 may be negatively charged. In this case, the chargeable particles 140 may oscillate near a cathode from among the first and second electrodes 310 and 320, and therefore, unlike FIGS. 11A and 11B, the antenna unit 480 may be modified to be electrically connected between the voltage source 350 and the second electrode 320 which may function as a cathode.

Figure 12:
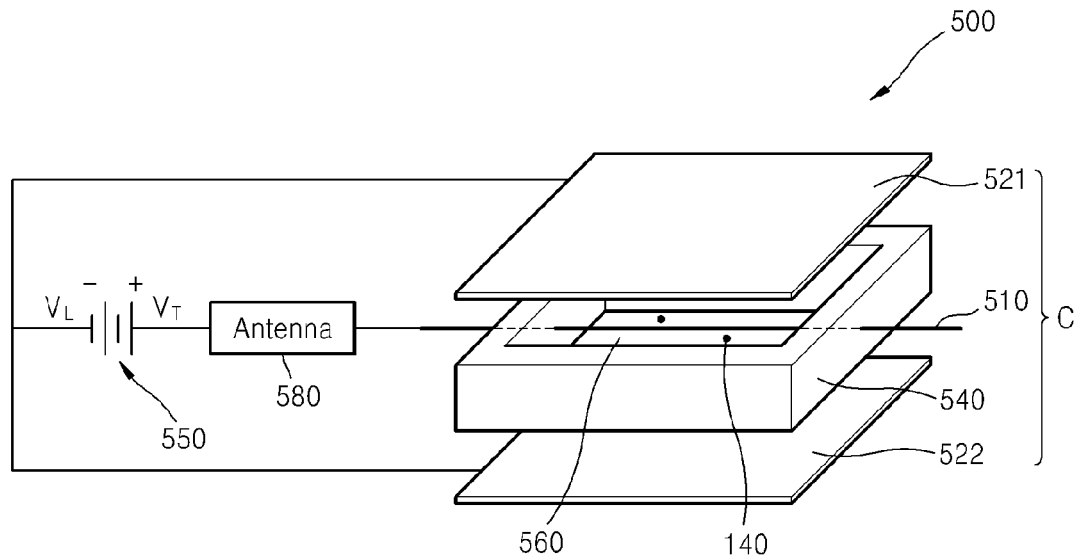
FIG. 12 is a perspective view of an electromagnetic wave generator according to another exemplary embodiment.

FIG. 12 is a perspective view of an electromagnetic wave generator 500 according to another exemplary embodiment.

The electromagnetic wave generator 500 includes one or more chargeable particles 140, a chamber structure C for forming an inner space 560 where the chargeable particles 140 are disposed, the chamber structure C including an electrode unit for forming an electric field in the inner space 560, a power circuit unit including a voltage source 550 for applying a voltage to the electrode unit in order to form the electric field in the inner space 560, and an antenna unit 580 electrically connected to the electrode unit and for radiating an electromagnetic wave by induced current oscillation.

In more detail, the chamber structure C includes first and second electrodes 521 and 522 facing each other and spaced apart from each other, a spacer 540 surrounding a space between the first and second electrodes 521 and 522 to form the inner space 560, and a wire unit 510 disposed across the inner space 560 and having one end penetrating through the spacer 540 and exposed to an external environment.

The power circuit unit may be configured to allow the first and second electrodes 521 and 522 to have the same electric potential and to apply a voltage between the first and second electrodes 521 and 522 and the wire unit 510. As illustrated in FIG. 12, the power circuit unit may be configured in such a way that the first and second electrodes 521 and 522 may be connected as a cathode to the same circuit line and then to the voltage source 550, and that the wire unit 510 may be connected as an anode to the voltage source 550.

The antenna unit 580 may have one end connected to the wire unit 510, and may be connected between the voltage source 550 and the wire unit 510, as illustrated in FIG. 12. It is understood, however, that the antenna unit 580 is not limited to the connection configuration shown in FIG. 12, and may alternatively be connected to, for example, another end of the wire unit 510.

The antenna unit 580 is disposed near the wire unit 510 that is the anode on the assumption that the chargeable particles 140 are positively charged. As described above, in this case, the chargeable particles 140 oscillate near the wire unit 510 that may function as an anode and a substantial amount of induced current oscillation occurs on the wire unit 510.

Meanwhile, the chargeable particles 140 may be negatively charged and, in this case, the antenna unit 580 may be modified to be connected to the first electrode 521 or the second electrode 522 that may function as a cathode.

Figure 13:
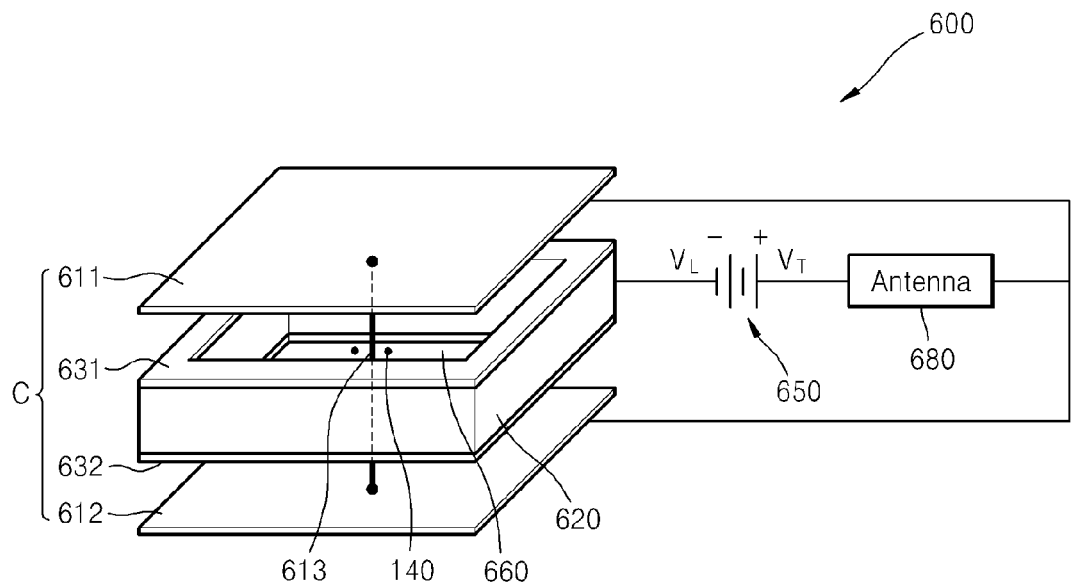
FIG. 13 is a perspective view of an electromagnetic wave generator according to another exemplary embodiment.

FIG. 13 is a perspective view of an electromagnetic wave generator 600 according to another exemplary embodiment.

The electromagnetic wave generator 600 according to the exemplary embodiment shown in FIG. 13 is different from the electromagnetic wave generator 500 illustrated in FIG. 12, in that a configuration of the chamber structure C shown in FIG. 13 is different from the a configuration of the chamber structure C shown in FIG. 12. The chamber structure C includes first and second electrodes 611 and 612 facing each other and spaced apart from each other, a spacer 620 surrounding a space between the first and second electrodes 611 and 612 to form an inner space 660, the spacer 620 being formed of a conductive material, and a wire unit 613 for electrically connecting the first and second electrodes 611 and 612 in the inner space 660.

Also, a first insulating unit 631 is disposed between the spacer 620 and the first electrode 611 to insulate the spacer 620 and the first electrode 611 from each other, and a second insulating unit 632 is disposed between the spacer 620 and the second electrode 612 to insulate the spacer 620 and the second electrode 612 from each other.

A power circuit unit may be configured to enable the first and second electrodes 611 and 612 to have the same electric potential and to apply a voltage between the first and second electrodes 611 and 612 and the spacer 620. As illustrated in FIG. 13, the power circuit unit may be configured in such a way that the first and second electrodes 611 and 612 may be connected as an anode to the same circuit line and then to a voltage source 650, and that the spacer 620 may be connected as a cathode to the voltage source 650.

The antenna unit 680 may have one end connected to the circuit line connected to the first and second electrodes 611 and 612, and may be connected between the voltage source 650 and the circuit line, as illustrated in FIG. 13. It is understood, however, that the antenna unit 680 is not limited to the connection configuration shown in FIG. 13, and may be connected to, for example, another end of the first electrode 611 or the second electrode 612.

The antenna unit 680 is disposed near the first and second electrodes 611 and 612 that correspond to the anode, on the assumption that the chargeable particles 140 are positively charged. As described above, in this case, the chargeable particles 140 oscillate near the anode, i.e., the wire unit 613 for connecting the first and second electrodes 611 and 612 in the current exemplary embodiment, and a substantial amount of induced current oscillation occurs on the first and second electrodes 611 and 612.

Meanwhile, the chargeable particles 140 may be negatively charged and, in this case, the antenna unit 680 may be modified to be connected to the spacer 620 that may function as a cathode.

Figure 14:
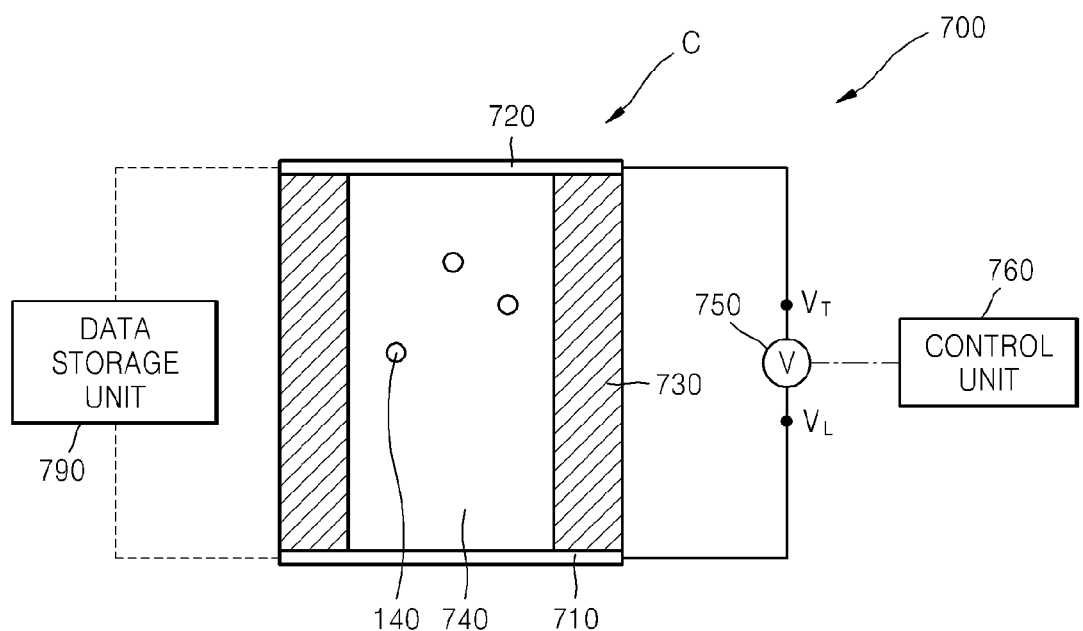
FIG. 14 is a cross-sectional view of a bit generator according to an exemplary embodiment.

FIG. 14 is a cross-sectional view of a bit generator 700 according to an exemplary embodiment.

The bit generator 700 includes one or more chargeable particles 140, a chamber structure C for forming an inner space 740 in which the chargeable particles 140 are disposed, the chamber structure C including an electrode unit for forming an electric field in the inner space 740, a voltage source 750 for applying a voltage to the electrode unit in order to generate the electric field in the inner space 740, a control unit 760 for controlling the voltage source 750 to selectively apply the voltage to the electrode unit, and a data storage unit 790 for storing bit data corresponding to whether induced current oscillation is generated by the electrode unit.

As illustrated in FIG. 14, the chamber structure C includes first and second electrodes 710 and 720 facing each other and spaced apart from each other, and a spacer 730 surrounding a space between the first and second electrodes 710 and 720 to form the inner space 740. However, the chamber structure C is not limited to having the above shape and may have any shape as long as the chargeable particles 140 are disposable in an electric field formed by the voltage applied to the electrode unit.

The chargeable particles 140 may be positively charged and, in this case, the chargeable particles 140 oscillate near an anode from among the first and second electrodes 710 and 720. That is, the voltage source 750 applies a voltage between the first and second electrodes 710 and 720 in such a way that $V_T > V_L$ is satisfied, the chargeable particles 140 oscillate near the second electrode 720, and thus, induced current oscillation occurs at the second electrode 720. When the induced current oscillation is sensed, this state is determined as bit data "1". If the voltage source 750 does not apply a voltage between the first and second electrodes 710 and 720, $V_T = V_L$ is satisfied, and induced current oscillation does not occur at the second electrode 720. This state is determined as bit data "0".

Alternatively, the chargeable particles 140 may be negatively charged. In this case, if $V_T > V_L$, induced current oscillation occurs at the first electrode 710 that may function as a cathode. If $V_T = V_L$, induced current oscillation does not occur. The state when induced current oscillation occurs at the first electrode 710 is determined as bit data "1", and the state when induced current oscillation does not occur is determined as bit data "0".

Accordingly, if the chargeable particles 140 are positively charged, the data storage unit 790 may be connected to an anode from among the first and second electrodes 710 and 720. If the chargeable particles 140 are negatively charged, the data storage unit 790 may be connected to a cathode from among the first and second electrodes 710 and 720.

Generation of bit data according to the above principle may be the basis of operating a binary computer and, if the above-described bit generator 700 is used, the binary computer may have a very small structure in comparison to a typical transistor-based computer.

Also, various logic circuits and memory circuits may be realized by using oscillating charged particles.

Figure 15A:
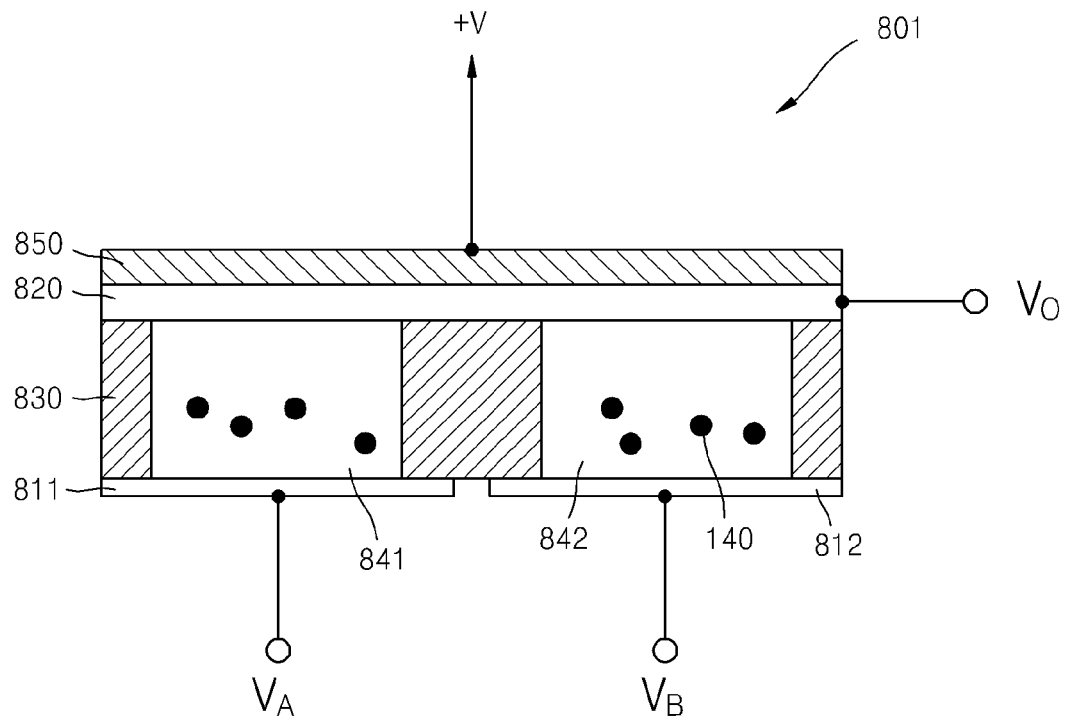
FIG. 15A is a cross-sectional view of an AND gate according to an exemplary embodiment.
Figure 15B:
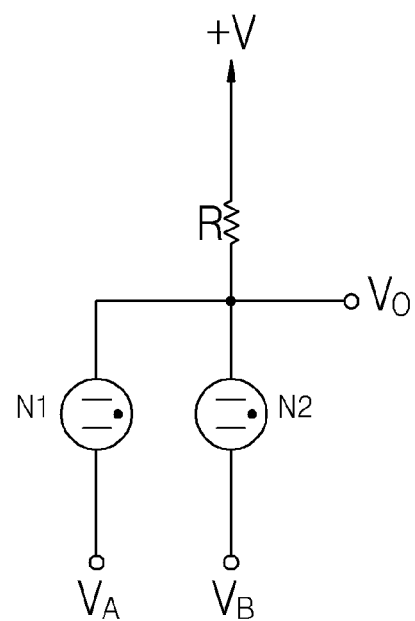
FIG. 15B is an equivalent circuit diagram of FIG. 15A.

FIG. 15A is a cross-sectional view of an AND gate 801 according to an exemplary embodiment. FIG. 15B is an equivalent circuit diagram of FIG. 15A.

The AND gate 801 includes a barrier structure 830 for forming first and second inner spaces 841 and 842 separated from each other, one or more chargeable particles 140 disposed in each of the first and second inner spaces 841 and 842, first and second electrodes 811 and 812 formed under the barrier structure 830 to respectively cover the first and second inner spaces 841 and 842, a common electrode 820 formed on the barrier structure 830 to entirely cover the first and second inner spaces 841 and 842, and a resistor 850 formed on the common electrode 820.

The resistor 850 may be connected to a voltage source having a fixed voltage V. Input voltages $V_A$ and $V_B$ are respectively applied to the first and second electrodes 811 and 812, a resistance R of the resistor 850 and the fixed voltage V of the voltage source connected to the resistor 850 may be determined according to user criteria, and accordingly, a reference value of an output voltage Vo may be determined.

If both of the input voltages $V_A$ and $V_B$ satisfy predetermined voltage conditions, the output voltage Vo at the common electrode 820 has a value corresponding to "1". If only one of the input voltages $V_A$ and $V_B$ satisfies the predetermined voltage condition, the output voltage Vo has a value corresponding to "0". The resistance R of the resistor 850 and the fixed voltage V may be arbitrarily selected. For example, it may be assumed that the chargeable particles 140 oscillate if a voltage between the common electrode 820 and the first electrode 811 or the second electrode 812 is equal to or greater than 50V, and it may be determined that the output voltage Vo is 50V if the input voltages $V_A$ and $V_B$ are 0V.

If both of the input voltages $V_A$ and $V_B$ are 0V, the output voltage Vo may be 50V as initially set.

From this state, if the input voltages $V_A$ and $V_B$ are increased to 40V, since the voltage between the common electrode 820 and the first electrode 811 is 10V and the voltage between the common electrode 820 and the second electrode 812 is also 10V, the chargeable particles 140 do not oscillate in the first and second inner spaces 841 and 842, and thus a conduction path is not formed. Accordingly, a current flowing through the resistor 850 is gradually reduced, a voltage drop from the fixed voltage V due to the resistance R is reduced, and thus, the output voltage Vo is gradually increased from 50V. If the output voltage Vo is increased to 90V, since the voltage between the common electrode 820 and the first electrode 811 is 50V and the voltage between the common electrode 820 and the second electrode 812 is also 50V so as to form a conduction path, the output voltage Vo is maintained at 90V.

When the input voltages $V_A$ and $V_B$ are 0V and the output voltage Vo is 50V as initially set, if one of the input voltages $V_A$ and $V_B$ is 0V and the other of the input voltages $V_A$ and $V_B$ is increased to 40V, for example, if the input voltage $V_A$ is 0V and the input voltage $V_B$ is 40V, since the voltage between the common electrode 820 and the first electrode 811 is 50V, the chargeable particles 140 oscillate in the first inner space 841, a conduction path is maintained, and the output voltage Vo is maintained at 50V.

As described above, according to an exemplary embodiment, the output voltage Vo has a value corresponding to "1", for example, 90V, only if both of the input voltages $V_A$ and $V_B$ are greater than 0V. Otherwise, the output voltage Vo has a value corresponding to "0", for example, 50V.

The structure illustrated in FIG. 15A operates as shown in the equivalent circuit of FIG. 15B. In more detail, by oscillating the chargeable particles 140 in the first and second inner spaces 841 and 842 in FIG. 15A, a function conventionally performed by using neon lamps N1 and N2 is performed. However, according to the exemplary embodiment shown in FIGS. 15A and 15B, in comparison to a conventional case when hundreds of thousands of particles or millions of particles are required to perform such a function by using neon lamps, only a very small number of chargeable particles 140 are required. For example, the number of chargeable particles 140 may be equal to or greater than one and equal to or less than a thousand, e.g., about several hundred particles. Also, in comparison to a logic circuit formed by using neon lamps, which has an operation speed of about 60 kHz to 1 MHz, if oscillation of charged particles is used, an operation speed in a THz range may be achieved.

Figure 16A:
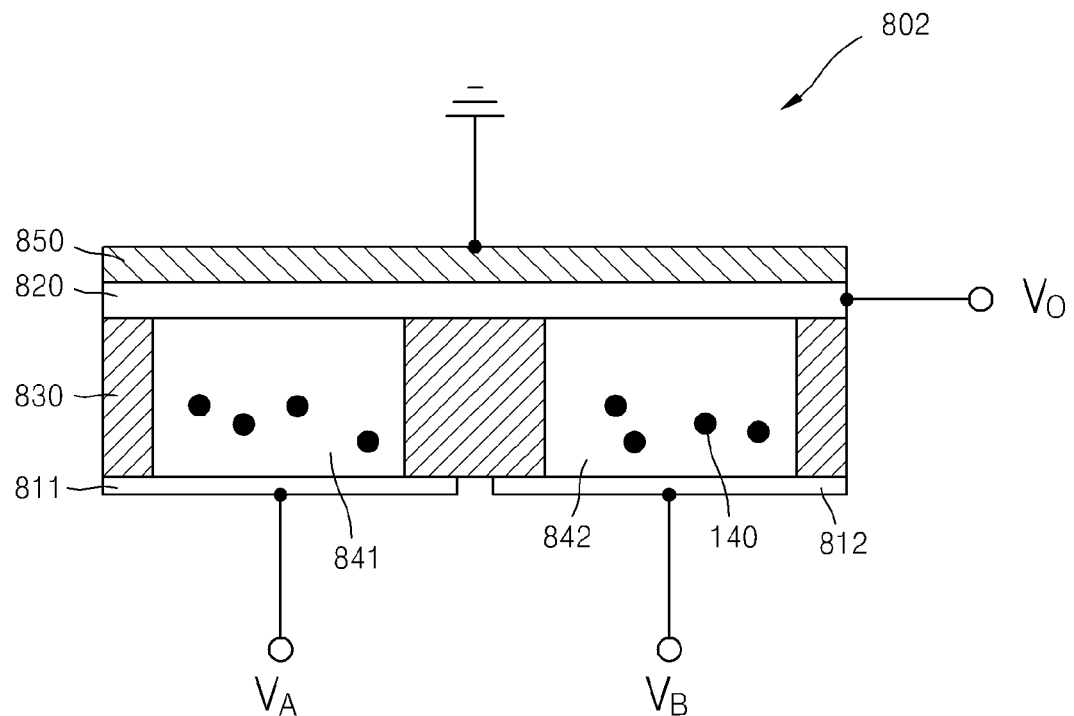
FIG. 16A is a cross-sectional view of an OR gate according to an exemplary embodiment.
Figure 16B:
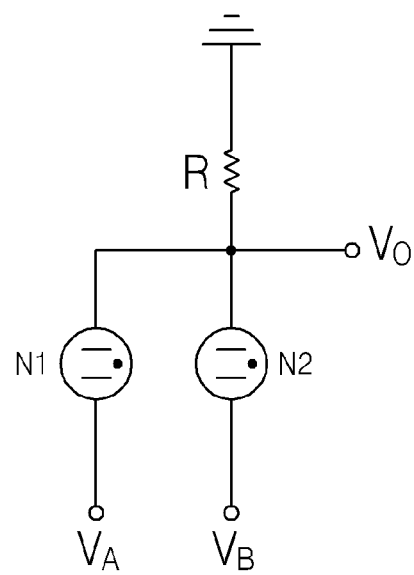
FIG. 16B is an equivalent circuit diagram of FIG. 16A.

FIG. 16A is a cross-sectional view of an OR gate 802 according to an exemplary embodiment. FIG. 16B is an equivalent circuit diagram of FIG. 16A.

The OR gate 802 includes a barrier structure 830 for forming first and second inner spaces 841 and 842 separated from each other, one or more chargeable particles 140 disposed in each of the first and second inner spaces 841 and 842, first and second electrodes 811 and 812 formed under the barrier structure 830 to respectively cover the first and second inner spaces 841 and 842, a common electrode 820 formed on the barrier structure 830 to entirely cover the first and second inner spaces 841 and 842, and a resistor 850 formed on the common electrode 820. Input voltages $V_A$ and $V_B$ are respectively applied to the first and second electrodes 811 and 812, and the resistor 850 is connected to the ground.

If one of the input voltages $V_A$ and $V_B$ satisfies a predetermined voltage condition, an output voltage Vo at the common electrode 820 has a value corresponding to "1". If none of the input voltages $V_A$ and $V_B$ satisfies the predetermined voltage condition, the output voltage Vo has a value corresponding to "0".

Figure 17A:
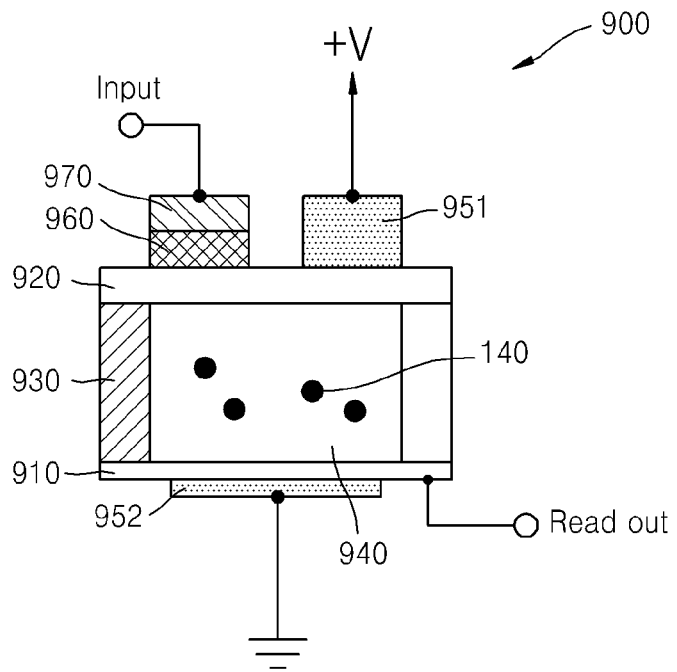
FIG. 17A is a cross-sectional view of a memory circuit according to an exemplary embodiment.
Figure 17B:
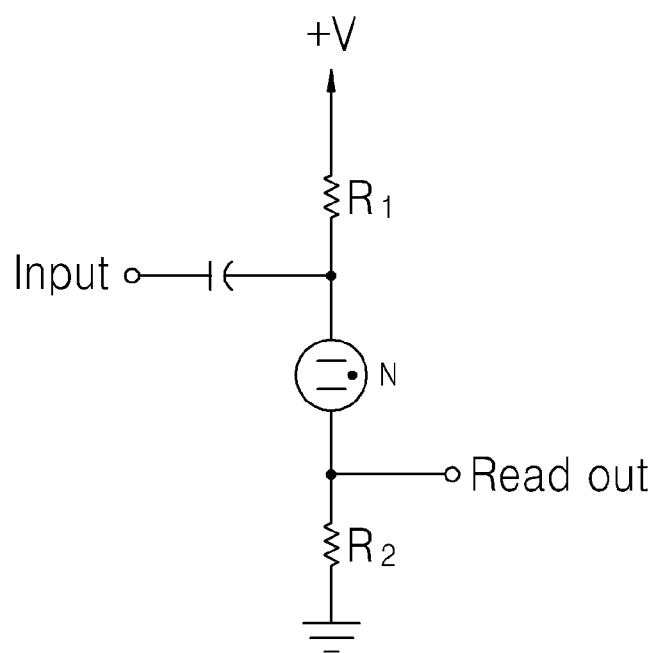
FIG. 17B is an equivalent circuit diagram of FIG. 17A.

FIG. 17A is a cross-sectional view of a memory circuit 900 according to an exemplary embodiment. FIG. 17B is an equivalent circuit diagram of FIG. 17A.

The memory circuit 900 includes a barrier structure 930 for forming an inner space 940, first and second electrodes 920 and 910 respectively formed on top of and under the inner space 940, and one or more chargeable particles 140 disposed in the inner space 940. A dielectric layer 960 and a third electrode 970 are disposed on the first electrode 920 so as to form a capacitor, and a first resistor 951 is also disposed on the first electrode 920. A second resistor 952 is disposed on the second electrode 910. The first resistor 951 may be connected to a voltage source having a predetermined fixed voltage, and the second resistor 952 may be grounded. According to an input of the third electrode 970, a read out of the second electrode 910 is formed.

The above-described alignments of circuit elements for forming a logic circuit (Boolean circuit) or a memory circuit are exemplarily provided, and may be changed to various different forms capable of using a conduction path formed due to oscillation of charged particles.

As described above, an electromagnetic wave generator according to one or more of the above exemplary embodiments may use self-sustained oscillation of particles charged due to a DC voltage, and may include an antenna structure using induced current oscillation generated due to the self-sustained oscillation as a source of an electromagnetic wave, so as to efficiently transmit the generated electromagnetic wave.

Since the electromagnetic wave generator according to exemplary embodiments does not require motion of an electron between a cathode and an anode to generate an electromagnetic wave, power consumption may be low, thereby increasing the efficiency of generating an electromagnetic wave.

Also, the frequency of a generated electromagnetic wave may be easily adjusted based on a voltage applied between a cathode and an anode.

A bit generator according to one or more of the above exemplary embodiments may use self-sustained oscillation of particles charged due to a DC voltage, and may generate bit data according to whether induced current oscillation occurs.

The bit generator may have a very small structure in comparison to a typical transistor-based bit generator, and may be used in a microcomputer.

Also, a logic circuit or a memory circuit according to one or more of the above exemplary embodiments may be formed by using oscillation of charged particles and may have a very high operation speed in comparison to a conventional configuration using neon lamps.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

What is claimed is:

1. An electromagnetic wave generator comprising:
a first electrode and a second electrode facing and spaced apart from the first electrode; a chargeable particle disposed between the first and the second electrodes;
a voltage source which applies a voltage between the first and the second electrodes; and an antenna which is electrically connected to one of the first and the second electrodes
and which radiates an electromagnetic wave due to induced current oscillation based on the applied voltage,
wherein the voltage source applies a direct current (DC) voltage between the first and the second electrodes, and
wherein the induced current oscillation is generated due to self-sustained oscillation of the chargeable particle based on the applied DC voltage.

2. The electromagnetic wave generator of claim 1, further comprising a chamber disposed between the first and the second electrodes, the chamber comprising a vacuum therein or being filled with a noble gas,
wherein the chargeable particle is disposed in the chamber.

3. The electromagnetic wave generator of claim 2, wherein the first and the second electrodes have shapes of a cylindrical core and a cylindrical shell, respectively.

4. The electromagnetic wave generator of claim 3, wherein the first and the second electrodes form inner walls of the chamber.

5. The electromagnetic wave generator of claim 2, wherein the chamber is formed as a through hole formed in a dielectric structure.

6. The electromagnetic wave generator of claim 5, wherein the through hole is formed in a cylindrical shape.

7. The electromagnetic wave generator of claim 5, wherein the first and the second electrodes are respectively formed to cover an upper portion and a lower portion of the through hole.

8. The electromagnetic wave generator of claim 1, wherein the chargeable particle comprises a conductive material or an ionized atom which is electrically chargeable.

9. The electromagnetic wave generator of claim 1, wherein the chargeable particle is a particle that is constantly maintained in a charged state regardless of whether the voltage is applied between the first and the second electrodes, or a particle that is charged only when the voltage is applied between the first and the second electrodes and is discharged when the applying of the voltage is stopped.

10. The electromagnetic wave generator of claim 1, wherein, if the chargeable particle is positively charged, the chargeable particle oscillates near an anode from among the first and the second electrodes.

11. The electromagnetic wave generator of claim 10, wherein the antenna is electrically connected to the anode.

12. The electromagnetic wave generator of claim 1, wherein, if the chargeable particle is negatively charged, the chargeable particle oscillates near a cathode from among the first and the second electrodes.

13. The electromagnetic wave generator of claim 12, wherein the antenna is electrically connected to the cathode.

14. The electromagnetic wave generator of claim 1, wherein the antenna comprises a rod antenna, a helical antenna, or a circular antenna.

15. An electromagnetic wave generator comprising:
a first electrode and a second electrode facing and spaced apart from the first electrode; a plurality of chambers disposed between the first and the second electrodes;
one or more chargeable particles disposed in each of the plurality of chambers;
a voltage source which applies a voltage between the first and the second electrodes; and an antenna electrically connected to one of the first and the second electrodes and which
radiates an electromagnetic wave due to induced current oscillation based on the applied voltage,
wherein the voltage source applies a direct current (DC) voltage between the first and the second electrodes, and
wherein the induced current oscillation is generated due to self-sustained oscillation of
the one or more chargeable particles based on the applied DC voltage.

16. The electromagnetic wave generator of claim 15, wherein the plurality of chambers comprises a vacuum therein or is filled with a noble gas.

17. The electromagnetic wave generator of claim 15, further comprising a dielectric substrate having a plurality of through holes forming the plurality of chambers.

18. The electromagnetic wave generator of claim 17, wherein the first and the second electrodes are respectively formed on top of and under the dielectric substrate to cover the plurality of through holes.

19. The electromagnetic wave generator of claim 18, wherein the plurality of through holes are formed in a cylindrical shape.

20. The electromagnetic wave generator of claim 15, wherein each of the one or more chargeable particles is a particle that is constantly maintained in a charged state regardless of whether the voltage is applied between the first and the second electrodes, or a particle that is charged only when the voltage is applied between the first and the second electrodes and is discharged when the applying of the voltage is stopped.

21. The electromagnetic wave generator of claim 15, wherein, if the one or more chargeable particles are positively charged, the one or more chargeable particles oscillate near an anode from among the first and the second electrodes.

22. The electromagnetic wave generator of claim 21, wherein the antenna is electrically connected to the anode.

23. The electromagnetic wave generator of claim 15, wherein, if the one or more chargeable particles are negatively charged, the one or more chargeable particles oscillate near a cathode from among the first and the second electrodes.

24. The electromagnetic wave generator of claim 23, wherein the antenna is electrically connected to the cathode.

25. The electromagnetic wave generator of claim 15, wherein the antenna comprises a rod antenna, a helical antenna, or a circular antenna.

26. The electromagnetic wave generator of claim 1, wherein the chargeable particle is core-shell structured where a conductive core is surrounded by a dielectric shell.

27. An electromagnetic wave generator
comprising: one or more chargeable particles;

a chamber structure which forms an inner space in which the one or more chargeable particles are disposed, and which comprises an electrode unit which forms an electric field in the inner space;

a power circuit unit comprising a voltage source which applies a voltage to the electrode unit in order to form the electric field in the inner space; and an antenna electrically connected to the electrode unit and which radiates an electromagnetic wave due to induced current oscillation based on the applied voltage, wherein the voltage source applies a direct current (DC) voltage to the electrode unit and wherein the induced current oscillation is generated due to self-sustained oscillation of the one or more chargeable particles based on the applied DC voltage.

28. The electromagnetic wave generator of claim 27, wherein the chamber structure comprises:

a first electrode and a second electrode facing and spaced apart from the first electrode;

a spacer surrounding a space between the first and the second electrodes to form the inner space; and a wire disposed across the inner space and having one end penetrating through the spacer and exposed to an external environment.

29. The electromagnetic wave generator of claim 28, wherein the power circuit unit is configured to enable the first and the second electrodes to have a same electric potential and to apply the voltage between the first and second electrodes and the wire.

30. The electromagnetic wave generator of claim 29, wherein the one or more chargeable particles are positively charged, and wherein the wire and the first and the second electrodes are connected to the voltage source in such a way that the wire functions as an anode and that the first and the second electrodes function as a cathode.

31. The electromagnetic wave generator of claim 30, wherein the antenna has one end connected to the wire.

32. The electromagnetic wave generator of claim 27, wherein the chamber structure comprises:

a first electrode and a second electrode facing and spaced apart from the first electrode;

a spacer surrounding a space between the first and the second electrodes to form the inner space, and formed of a conductive material;

a first insulator disposed between the spacer and the first electrode to insulate the spacer and the first electrode from each other;

a second insulator disposed between the spacer and the second electrode to insulate the spacer and the second electrode from each other; and a wire which electrically connects the first and second electrodes in the inner space.

33. The electromagnetic wave generator of claim 32, wherein the power circuit unit is configured to enable the first and the second electrodes to have a same electric potential and to apply the voltage between the first and the second electrodes and the spacer.

34. The electromagnetic wave generator of claim 33, wherein the one or more chargeable particles are positively charged, and wherein the wire and the first and the second electrodes are connected to the voltage source in such a way that the wire functions as an anode and that the first and the second electrodes function as a cathode.

35. The electromagnetic wave generator of claim 27, wherein the chargeable particle is core-shell structured where a conductive core is surrounded by a dielectric shell.

36. The electromagnetic wave generator of claim 35, wherein the antenna has one end connected to the first electrode or the second electrode.

37. A bit generator comprising:

one or more chargeable particles;

a chamber structure which forms an inner space in which the one or more chargeable particles are disposed, and which comprises an electrode unit which forms an electric field in the inner space;

a voltage source which applies a DC voltage to the electrode unit in order to form the electric field in the inner space, wherein the electric field creates a self-sustained oscillation of the one or more chargeable particles based on the applied DC voltage, wherein a current oscillation is induced due to the self-sustained oscillation of the one or more chargeable particles;

a control unit which controls the voltage source to selectively apply the DC voltage to the electrode unit; and a data storage unit which stores bit data corresponding to whether the induced current oscillation is generated by the electrode unit.

38. The bit generator of claim 37, wherein the chamber structure comprises:

a first electrode and a second electrode facing and spaced apart from the first electrode; and a spacer surrounding a space between the first and the second electrodes to form the inner space.

39. The bit generator of claim 38, wherein the one or more chargeable particles are positively charged, and wherein the data storage unit is connected to an anode from among the first and the second electrodes.

40. The bit generator of claim 38, wherein the one or more chargeable particles are negatively charged, and wherein the data storage unit is connected to a cathode from among the first and the second electrodes.

41. The bit generator of claim 37, wherein the chargeable particle is core-shell structured where a conductive core is surrounded by a dielectric shell.

42. A radiation generation device, comprising: a chamber;

a charged particle disposed in the chamber which oscillates according to a direct current (DC) electric field applied to the chamber; and an antenna which radiates an electromagnetic wave based on the oscillations of the charged particle, wherein the oscillations of the charged particle are self-sustained oscillations based on the applied DC electric field, and wherein a wavelength of the electromagnetic wave radiated by the antenna is determined based on the DC electric field applied to the chamber.

43. The radiation generation device of claim 42, further comprising:

a first electrode disposed at a first end of the chamber;

a second electrode disposed at a second end of the chamber opposite the first end; and a voltage source connected to the first and second electrodes which applies a voltage between the first and second electrodes to thereby apply the DC electric field to the chamber.

44. The radiation generation device of claim 42, wherein the electromagnetic wave comprises a terahertz (THz) wave having a frequency of about 0.1 to about 10 THz.

45. The radiation generation device of claim 43, wherein the oscillations of the charged particle are determined based on positions and potentials of the first electrode and the second electrode, and boundary conditions determined based on a surface charge density of the charged particle.

46. The radiation generation device of claim 42, wherein the charged particle comprises aluminum.

47. The radiation generation device of claim 42, wherein a frequency of the oscillations is based on a pressure inside of the chamber.

48. The radiation generation device of claim 42, wherein the charged particle comprises a conductive material or an ionized atom.

* * * * *